US008853569B2

(12) United States Patent
Hsieh

(10) Patent No.: US 8,853,569 B2
(45) Date of Patent: Oct. 7, 2014

(54) TOUCH-SENSING MODULE

(71) Applicant: E Ink Holdings Inc., Hsinchu (TW)

(72) Inventor: Yun-Nan Hsieh, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 103 days.

(21) Appl. No.: 13/688,178

(22) Filed: Nov. 28, 2012

(65) Prior Publication Data

US 2013/0213783 A1     Aug. 22, 2013

(30) Foreign Application Priority Data

Feb. 17, 2012  (TW) ............... 101105313 A

(51) Int. Cl.
*H01H 13/70* (2006.01)
*H03K 17/96* (2006.01)
*G06F 3/044* (2006.01)

(52) U.S. Cl.
CPC ...... *H03K 17/96* (2013.01); *G06F 2203/04103* (2013.01); *G06F 3/044* (2013.01)
USPC ............... 200/5 R; 200/600; 345/174; 29/622

(58) Field of Classification Search
USPC ......................................................... 200/600
See application file for complete search history.

(56) References Cited

U.S. PATENT DOCUMENTS

| | | | |
|---|---|---|---|
| 6,750,852 B2 * | 6/2004 | Gillespie et al. | 345/173 |
| 7,663,607 B2 * | 2/2010 | Hotelling et al. | 345/173 |
| 8,274,494 B2 * | 9/2012 | Frey et al. | 345/174 |
| 2006/0132454 A1 * | 6/2006 | Chen et al. | 345/173 |
| 2009/0160824 A1 * | 6/2009 | Chih-Yung et al. | 345/175 |
| 2009/0315859 A1 * | 12/2009 | Chien et al. | 345/175 |
| 2010/0044122 A1 | 2/2010 | Sleeman et al. | |
| 2010/0090979 A1 * | 4/2010 | Bae | 345/174 |
| 2010/0123675 A1 | 5/2010 | Ippel | |
| 2010/0123681 A1 | 5/2010 | Wu et al. | |
| 2010/0163394 A1 | 7/2010 | Tang et al. | |
| 2010/0315373 A1 * | 12/2010 | Steinhauser et al. | 345/174 |
| 2011/0007011 A1 | 1/2011 | Mozdzyn | |
| 2011/0157086 A1 | 6/2011 | Ozeki et al. | |
| 2011/0169751 A1 | 7/2011 | Kim et al. | |

FOREIGN PATENT DOCUMENTS

| | | |
|---|---|---|
| TW | 200915151 | 4/2009 |
| TW | 201115439 | 5/2011 |

OTHER PUBLICATIONS

"Office Action of Taiwan Counterpart Application", issued on Jun. 16, 2014, p. 1-p. 5.

* cited by examiner

*Primary Examiner* — Kyung Lee
(74) *Attorney, Agent, or Firm* — Jianq Chyun IP Office

(57) ABSTRACT

A touch-sensing module including a plurality of first sensing strings and a plurality of second sensing strings is provided. Each of the first sensing strings includes a first strip-shaped conductive line and a plurality of first sensing pads connected to a same side of the first strip-shaped conductive line. Each of the second sensing strings includes a second strip-shaped conductive line and a plurality of second sensing pads connected to a same side of the second strip-shaped conductive line. The first strip-shaped conductive lines of the first sensing strings cross the second strip-shaped conductive lines of the second sensing strings. A crossing position of each of the first strip-shaped conductive lines and each of the second strip-shaped conductive lines forms an electrical reference node.

7 Claims, 3 Drawing Sheets

TOUCH-SENSING MODULE

CROSS-REFERENCE TO RELATED APPLICATION

This application claims the priority benefit of Taiwan application serial no. 101105313, filed on Feb. 17, 2012. The entirety of the above-mentioned patent application is hereby incorporated by reference herein and made a part of this specification.

BACKGROUND OF THE DISCLOSURE

1. Field of the Disclosure

The invention is directed to a sensing module, and more particularly, to a touch-sensing module.

2. Description of Related Art

With the advancement of the electronic technology and the displaying technology, great breakthroughs have been brought to the currently used human-machine interfaces that are no longer limited to using mice or operating keyboards. At present, one of the most user-friendly and popular operation methods to users is the touch-sensing operation method by which the users use fingers to press icons that are displayed on the screen for operation. This intuitional operation method is easy for even the young and the old to operate.

The touch-sensing interface is generally constituted of a display and a touch-sensing panel that is attached thereto. Currently, types of touch-sensing panels in the related art can be classified into the resistive type, the capacitive type, the infrared type and the surface acoustic wave (SAW) type, etc. The capacitive type of the touch-sensing panel in the related art includes a number of first touch-sensing strings and a number of second touch-sensing strings crossing with each other. Each of the sensing strings has a number of rhomboidal sensing pads that are serially connected. In addition, to fully distributed the rhomboidal sensing strings in a rectangular space, the sensing pads that are serially connected at two ends of each of the sensing strings is in a triangle shape, i.e. a half of the rhombus shape. The triangular sensing pads are located at four sides of the touch-sensing panel and surround the rhomboidal sensing pad.

However, the capacitive sensing behavior of the triangular sensing pads located at the four sides of the touch-sensing panel is different from that of the rhomboidal sensing pads so that the touch-sensing position is difficult to predict accurately. Thus, the algorithm complexity of the interpreting circuit used for interpreting the sensing signals sent from the sensing pads is increased with the existence of the triangular sensing pads, which results in the raise of the complexity of the interpreting circuit.

Meanwhile, when a front frame is used for covering the triangular sensing pads and the function of the triangular sensing pads is not used, traces connected with one side of the sensing string occupy extra spaces, and the front frame is difficult to form a symmetrical shape, or the width of the frame edges is too wide.

SUMMARY OF THE DISCLOSURE

The invention is directed to a touch-sensing module capable of simplifying the algorithm complexity or effectively utilizing spaces in the peripheral regions of the module.

According to an embodiment of the invention, a touch-sensing module is provided. The touch-sensing module includes a plurality of first sensing strings and a plurality of second sensing strings. Each of the first sensing strings includes a first strip-shaped conductive line and a plurality of first sensing pads. The first sensing pads are connected to a same side of the first strip-shaped conductive line. Each of the second sensing strings includes a second strip-shaped conductive line and a plurality of second sensing pads. The second sensing pads are connected to a same side of the second strip-shaped conductive line. The first strip-shaped conductive lines of the first sensing strings cross the second strip-shaped conductive lines of the second sensing strings. An electrical reference node is formed in a crossing position of each of the first strip-shaped conductive lines and each of the second strip-shaped conductive lines. One first sensing pad is connected to a first conductive segment of the first strip-shaped conductive line at the same side of each of the electrical reference nodes. One second sensing pad is connected to a second conductive segment of the second strip-shaped conductive line at the same side of each of the electrical reference nodes.

In the touch-sensing module according to the embodiment of the invention, the first sensing pads of each of the first sensing strings are located at the same side of the first strip-shaped conductive line of each of the first sensing strings, and the second sensing pads of each of the second sensing strings is located at the same side of the second strip-shaped conductive line of each of the second sensing strings. One first sensing pad is connected to the first conductive segment at the same side of each of the electrical reference nodes. One second sensing pad is connected to the second conductive segment of the second strip-shaped conductive line at the same side of each of the electrical reference nodes. Therefore, each of the first sensing pads and each of the second sensing pads provided with the electrical reference node at one side thereof are respectively located at one end of the first strip-shaped conductive lines and at one end of the second strip-shaped conductive lines so as to simplify the complexity of algorithm used for interpreting sensing signals sent from each of the first sensing strings and each of the second sensing strings.

In order to make the aforementioned features and advantages of the invention more comprehensible, embodiments accompanied with figures are described in detail below.

BRIEF DESCRIPTION OF THE DRAWINGS

The accompanying drawings constituting a part of this specification are incorporated herein to provide a further understanding of the invention. Here, the drawings illustrate embodiments of the invention and, together with the description, serve to explain the principles of the invention.

DETAILED DESCRIPTION OF THE EMBODIMENTS

Figure 1A:
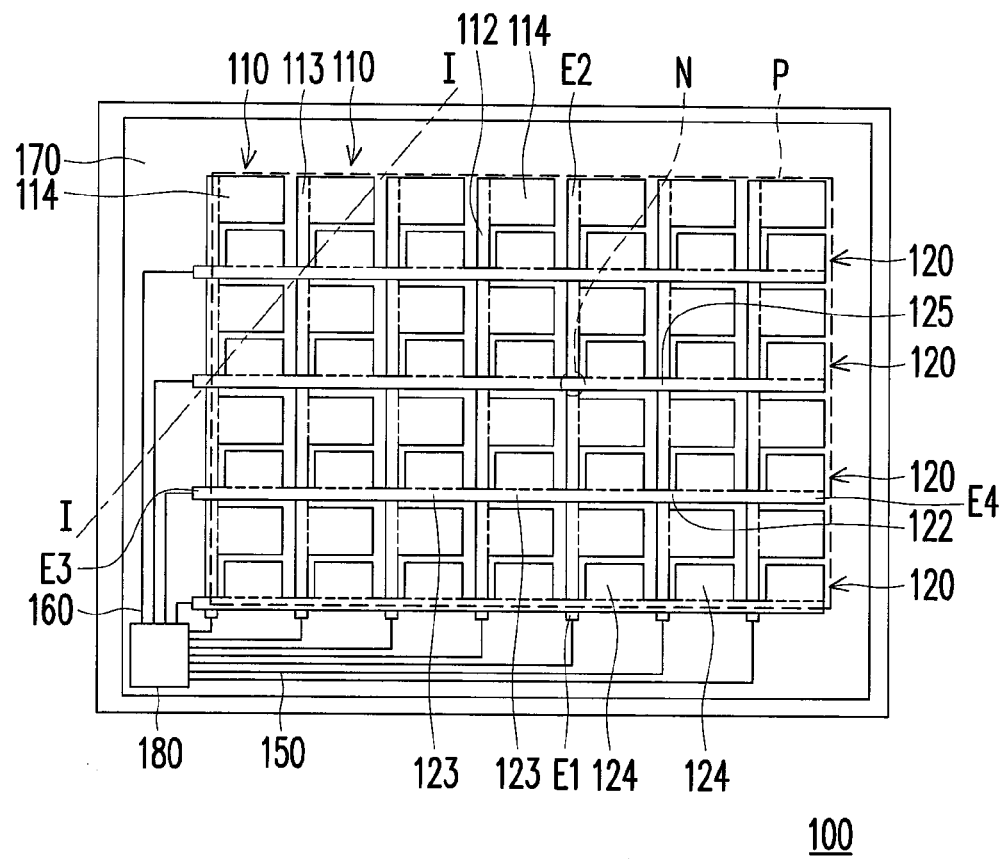
FIG. 1A is a schematic rear view illustrating a touch-sensing module according to an embodiment of the invention.
Figure 1B:
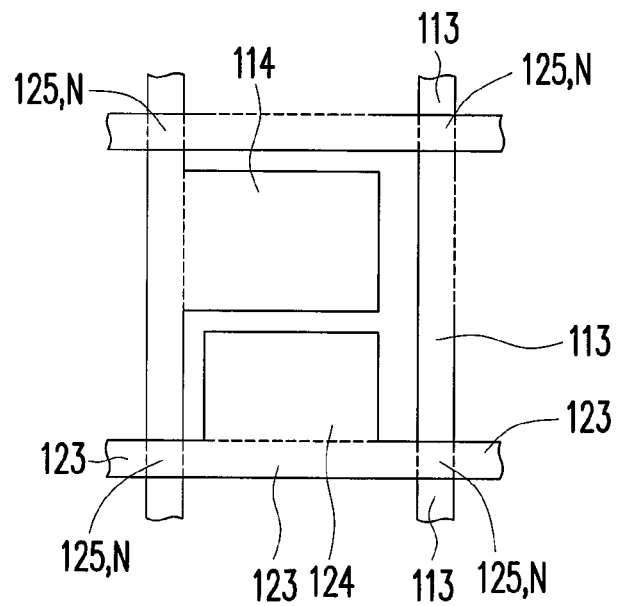
FIG. 1B is an enlarged partial view illustrating a touch-sensing module 100 illustrated in FIG. 1A.
Figure 1C:
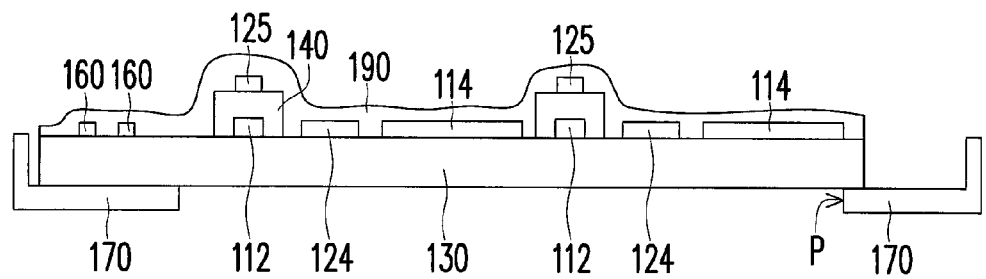
FIG. 1C is a schematic cross-sectional view illustrating the touch-sensing module illustrated in FIG. 1A along line I-I.

FIG. 1A is a schematic rear view illustrating a touch-sensing module according to an embodiment of the invention. FIG. 1B is an enlarged partial view illustrating the touch-sensing module 100 illustrated in FIG. 1A. FIG. 1C is a schematic cross-sectional view illustrating a touch-sensing module illustrated in FIG. 1A along line I-I. To simplify the illustration of drawings, FIG. 1C illustrates a substrate which is omitted and not shown in FIG. 1A. Referring to FIG. 1A and FIG. 1C, the touch-sensing module 100 of the present embodiment includes a plurality of first sensing strings 110 and a plurality of second sensing strings 120. Each of the first sensing strings 110 includes a first strip-shaped conductive line 112 and a plurality of first sensing pads 114. The first sensing pads 114 are connected to a same side of the first strip-shaped conductive line 112. For example, the first sensing pads 114 of each of the first sensing strings 110 are all located at the right side of the first strip-shaped conductive line 112 illustrated in FIG. 1A. Each of the second sensing strings 120 includes a second strip-shaped conductive line 122 and a plurality of second sensing pads 124. The second sensing pads 124 are connected to a same side of the second strip-shaped conductive line 122. For example, the second sensing pads 124 of each of the second sensing strings 120 are all located at the upper side of the first strip-shaped conductive line 122 as illustrated in FIG. 1A.

The first strip-shaped conductive line 112 of each of the first sensing strings 110 crosses the second strip-shaped conductive line 122 of each of the second sensing strings 120. An electrical reference node N is formed in a crossing position of each of the first strip-shaped conductive lines 112 and each of the second strip-shaped conductive lines 122. One first sensing pad 114 is connected to a first conductive segment 113 of the first strip-shaped conductive line 112 at the same side of each of the electrical reference nodes N, for example, the upper side as shown in FIG. 1A. One second sensing pad 124 is connected to a second conductive segment 123 of the second strip-shaped conductive line 122 at the same side of each of the electrical reference nodes N, for example, the right side as shown in FIG. 1A. For example, referring to FIG. 1A, one first conductive segment 113 is disposed between each of the electrical reference nodes N and its next upward electrical reference node N. One first conductive segment 113 is also disposed between each of the electrical reference nodes N at the top and an upper end of the first strip-shaped conductive line 112. In addition, the second conductive segment 123 is disposed between each of the electrical reference nodes N and its next rightward electrical reference node N. One second conductive segment 123 is also disposed between each of the electrical reference nodes N at the most right and a right end of the second strip-shaped conductive line 112. One first sensing pad 114 is connected to the first conductive segment 113 adjacent to an upper side of each of the electrical reference nodes N. One second sensing pad 124 is connected to the second conductive segment 123 adjacent to a right side of each of the electrical reference nodes N.

According to the present embodiment, the touch-sensing pad 100 further includes a substrate 130. The first sensing strings 110 and the second sensing strings 120 are all disposed on the substrate 130. In addition, the substrate 130 is, for example, a transparent substrate. However, in another embodiment, the substrate 130 may be a non-transparent substrate.

In the present embodiment, each of the first strip-shaped conductive lines 112 and each of the second strip-shaped conductive lines 122 are separated by an insulating material 140. In the present embodiment, the touch-sensing module 100 includes a plurality of insulating materials 140. The plurality of insulating materials 140 are respectively disposed at each of the electrical reference nodes N. In addition, according to the present embodiment, the first conductive segment 113, the second conductive segment 123, the first sensing pads 114 and the second sensing pads 124 are all located on the same plane. Further, each of the second strip-shaped conductive lines 122 further includes a plurality of jumper segments 125, as shown in FIG. 1C, which is respectively located on each of the electrical reference nodes N. Each of the jumper segments 125 is connected to two of second conductive segments 123 adjacent to each other and across the first strip-shaped conductive line 112. The jumper segments 125 and the first strip-shaped conductive line 112 are separated by the insulating material 140. In other words, the second conductive segments 123 are non-continuous conductive segments. The non-continuous second conductive segments are linked by the jumper segments 125 so as to form the second strip-shaped conductive line 122 in a continuous type.

According to another embodiment, the first sensing strings 110 and the second sensing strings 120 may also be located on different planes. The insulating material 140 may be an insulating film that covers the whole surface and is disposed between the two different planes so as to separate the first sensing strings 110 and the second sensing strings 120. In the case, the jumper segments 125 may not be adopted so that the second strip-shaped conductive line 122 is a conductive line continuously extending on a plane.

According to the present embodiment, the first sensing pads 114 and the second sensing pads 124 are transparent sensing pads. However, in another embodiment, the first sensing pads 114 and the second sensing pads 124 may be non-transparent sensing pads. In the present embodiment, the first strip-shaped conductive lines 112 and the second conductive segments 123 are, for example, transparent conductive lines. The jumper segments 125 are, for example, metal jumper segments. However, in another embodiment, the first strip-shaped conductive lines 112 and the second conductive segments 123 may also be metal conductive lines. Alternatively, the jumper segments 125 may also be transparent jumper segments.

In the present embodiment, the first sensing pad 114 and the second sensing pad 124 between two adjacent first strip-shaped conductive lines 112 and between two adjacent second strip-shaped conductive lines 122 are approximately fully distributed in an area surrounded by the two adjacent first strip-shaped conductive lines 112 and the two adjacent second strip-shaped conductive lines 122. In addition, the first sensing pad 114 and the second sensing pad 124 between the two adjacent first strip-shaped conductive lines 112 and between the two adjacent second strip-shaped conductive lines 122 are disposed separately from each other. Further, each of the first sensing pads 114 is, for example, in a rectangle, and each of the second sensing pads 124 is, for example, in a rectangle. However, in other embodiments, the each of the first sensing pads 114 and the each of the second sensing pads 124 may be in shapes other than a rectangle. The each of the first sensing pads 114 and the each of the second sensing pads 124 adjacent thereto are approximately fully distributed in an area surrounded by two adjacent first strip-shaped conductive lines 112 and two adjacent second strip-shaped conductive lines 122.

In the present embodiment, each of the first strip-shaped conductive lines 112 has a first end E1 and a second end E2 that are opposite to each other. Each of the second strip-shaped conductive lines 122 has a third end E3 and a fourth end E4 that are opposite to each other. The touch-sensing module 100 further includes a plurality of first traces 150, a plurality of second traces 160 and a front frame 170. The first traces 150 are electrically connected to the first ends E1 of the first strip-shaped conductive lines 112, respectively. The second traces 160 are electrically connected to the third ends E3 of the second strip-shaped conductive lines 122, respectively. In the present embodiment, the touch-sensing module 100 further includes an interpreting unit 180. The first traces 150 and the second traces 160 are electrically connected to the interpreting unit 180. The interpreting unit 180 is used for interpreting sensing signals sent from the first sensing strings 110 and the second sensing strings 120 so as to determine a position touched by fingers or a touch object, e.g. a stylus pen.

The front frame 170 covers the first traces 150 and the second traces 170. According to the present embodiment, the front frame 170 has an opening P so as to expose the first sensing pads 114 and the second sensing pads 124. In the present embodiment, the touch-sensing module 100 further includes a protecting layer 190 which covers the first sensing strings 110, the second sensing strings 120, the first traces 150 and the second traces 160. The protecting layer 190 is, for example, a transparent insulating layer. However, in another embodiment, the protecting layer 190 may also be a non-transparent insulating layer.

In the present embodiment, a capacity value of each of the electrical reference nodes N is a reference capacity value of one of the first sensing pads 114 and one of the second sensing pads 124 that are adjacent to the each of the electrical reference nodes N. With comparing the capacity value detected on one of the first sensing pads 114 and one of the second sensing pads 124 with the reference capacity value, the interpreting unit 180 can calculate an actual position touched by the finger or the touch object. The position touched by the finger or the touch object is, for example, on the substrate 130. In other embodiments, a resistance value multiplied by the capacity value of the each of the electrical reference nods N is a reference resistance-capacity value of one of the first sensing pads 114 and one of the second sensing pads 124 that are adjacent to the each of the electrical reference nodes N. Alternatively, an another appropriate electrical value of the each of the electrical reference nodes N is a reference electrical value for one of the first sensing pads 114 and one of the second sensing pads 124 that are adjacent to the each of the electrical reference nodes N. In the touch-sensing module 100 of the present embodiment, the first sensing pads 114 of each of the first sensing strings 110 are all located at the same side of the first strip-shaped conductive line 112 of the each of the first sensing strings 110, e.g. the right side as shown in FIG. 1A. The second pads 124 of each of the second sensing strings 120 are all located at the same side of the second strip-shaped conductive line 122 of the each of the second sensing strings 120, e.g. the upper side as shown in FIG. 1A. One first sensing pad 114 is connected to the first conductive segment 113 at the same side of each of the electrical reference nodes N, e.g. the upper side as shown in FIG. 1A. One second sensing pad 124 is connected to the second conductive segment 123 at the same side of each of the electrical reference nodes N, e.g. the right side as shown in FIG. 1A. Therefore, the first sensing pads 114 and the second sensing pads 124 provided with the electrical reference nodes N at one side are located at the second ends E2 of the first strip-shaped conductive lines 112, e.g. the upper ends as shown in FIG. 1A, and the fourth ends E4 of the second strip-shaped conductive lines 122, e.g. the right ends as shown in FIG. 1A. In other words, the first sensing pads 114 and the second sensing pads 124 provided with the electrical reference nodes N at one side are located at the upper side and the right side in FIG. 1A, instead of being located at the lower side and the left side in FIG. 1A. Besides the first sensing pads 114 and the second sensing pads 124 provided with the electrical reference nodes N at one side, the rest of the first sensing pads 114 and the second sensing pads 124 have four electrical reference nodes N located at four corners adjacent thereto. Accordingly, there are four capacitance values (or four values of the resistance value multiplied by the capacitance value) for reference so that the accuracy for detecting positions of the first sensing pads 114 and the second sensing pads 124 are enhanced. In the touch-sensing module 100 of the present embodiment, since the first sensing pads 114 and the second sensing pads 124 provided with the electrical reference nodes N at one side are located at two sides of the touch-sensing module 100, instead of four sides, the complexity of algorithm for the interpreting unit 180 to interpret the detection signals sent from the first sensing strings 110 and the second sensing strings 120 is simplified. Thus, the circuit structure and production cost of the interpreting unit 180 is economized.

Figure 2A:
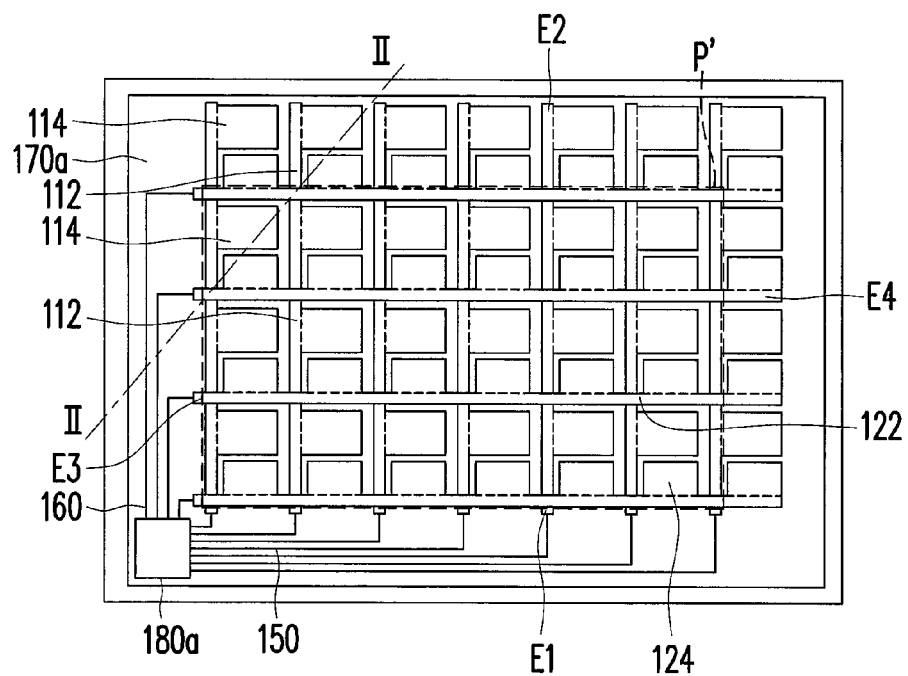
FIG. 2A is a schematic rear view illustrating a touch-sensing module according to another embodiment of the invention.
Figure 2B:
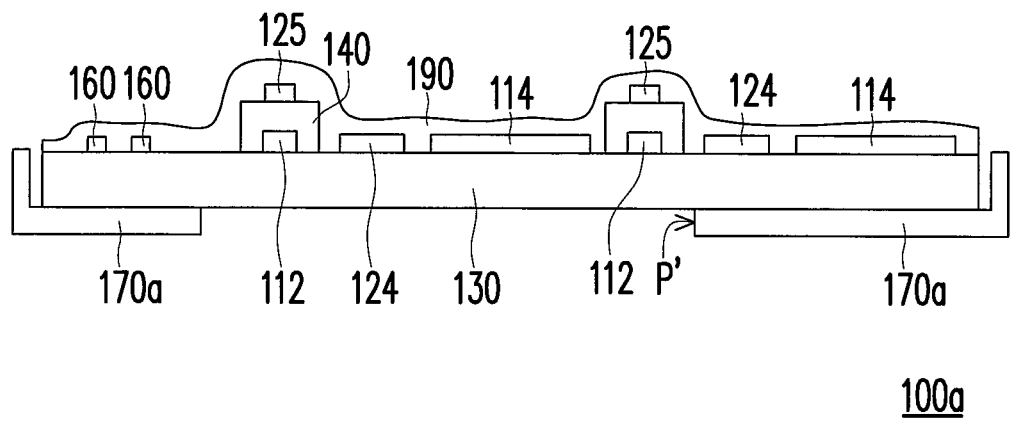
FIG. 2B is a schematic cross-sectional view illustrating the touch-sensing module illustrated in FIG. 2A along line II-II.

FIG. 2A is a schematic rear view illustrating a touch-sensing module according to another embodiment of the invention. FIG. 2B is a schematic cross-sectional view illustrating the touch-sensing module illustrated in FIG. 2A along line II-II. To simplify the illustration of drawings, FIG. 2B illustrates a substrate which is omitted and not shown in FIG. 2A. Referring to FIG. 2A and FIG. 2B, the touch-sensing module 100a of the present embodiment is similar to the touch-sensing module 100 illustrated in FIG. 1A and FIG. 1C. The difference therebetween is described as below. In the touch-sensing module 100a of the present embodiment, a front frame 170a not only covers first traces 150 and second traces 160, but also covers the first sensing pads 114 respectively connected to the second ends E2 of the first strip-shaped conductive lines 112 and the second sensing pads 124 respectively connected to the fourth ends E4 of the strip-shaped conductive lines 122. In other words, the first sensing pads 114 and the second sensing pads 124 exposed by an opening P' of the front frame 170a has the electrical reference nodes N disposed at four corners. The first sensing pads 114 and the second sensing pads 114 provided with the electrical reference nodes N at one side are covered by the front frame 170a and actually out-of-operation. By this way, the algorithm of an interpreting unit 180a is further simplified so as to economize the circuit structure and the cost of the interpreting unit 180a.

In the touch-sensing module 100a according to the present embodiment, since the first sensing pads 114 and the second sensing pads 124 provided with the electrical reference nodes N at one side, i.e. the out-of-operation first sensing pads 114 and the second sensing pads 124, are respectively located at the second ends E2 of the first strip-shaped conductive lines 112 and the fourth ends E4 of the second strip-shaped conductive lines 122 without being located at the first ends E1 of the first strip-shaped conductive lines 112 and the third ends E3 of the second strip-shaped conductive lines 122, first traces 150 can be disposed in a space by the first end E1 of each the first strip-shaped conductive line 112, and second traces 160 can be disposed in a space by the third end E3 of each the second strip-shaped conductive line 122. Accordingly, the space surrounding the four sides of the opening P' are fully utilized so that the shape of the front frame 170a is more symmetrical. Therefore, not only the front frame 170a is beautified but also the area surrounding the touch-sensing module 100a is effectively utilized so as to effectively narrow the width of borders of the front frame 170a.

In view of the foregoing, in the touch-sensing module according to the present embodiment, the first sensing pads of each of the first sensing strings are all located at the same side of the first strip-shaped conductive line of each of the first sensing strings. The second sensing pads of each of the second sensing strings are all located at the same side of the second strip-shaped conductive line of each of the second sensing strings. One first sensing pad is connected to the first conductive segment at the same side of the each of the electrical reference nodes. One second sensing pad is connected to the second conductive segment at the same side of the each of the electrical reference nodes. Thus, the first sensing pads and the second sensing pads provided with the electrical reference nodes at one side are respectively located at one end of the first strip-shaped conductive lines and one end of the second strip-shaped conductive lines so that the complexity of the algorithm for interpreting detection signals sent from the first sensing strings and the second sensing strings is simplified. In addition, in the sensing module according to the present embodiment, the out-of-operation first sensing pads and the second sensing pads are respectively located at the second ends of the first strip-shaped conductive lines and the fourth ends of the second strip-shaped conductive lines without being located at the first ends of the first strip-shaped conductive lines and the third ends of the second strip-shaped conductive lines. Therefore, the space by the first ends of the first strip-shaped conductive lines can be used for disposing the first traces, and the space by the third ends of the second strip-shaped conductive lines can be used for disposing the second trace. Accordingly, the space surrounding the four sides of the opening is fully utilized so that the shape of the front frame is more symmetrical. Therefore, not only the front frame is beautified but also the area surrounding the touch-sensing module is effectively utilized so as to effectively narrow the width of the borders of the front frame.

Although the invention has been disclosed with reference to the above embodiments, they are not intended to limit the invention. It will be apparent to one of the ordinary skill in the art that variations and modifications may be made without departing from the spirit and scope of the invention. Accordingly, the scope of the invention will be defined by the appended claims.

What is claimed is:

1. A touch-sensing module, comprising:
    a plurality of first sensing strings, each of the plurality of first sensing strings comprising:
        a first strip-shaped conductive line; and
        a plurality of first sensing pads, connected to a same side of the first strip-shaped conductive line;
    a plurality of second sensing strings, each of the plurality of second sensing strings comprising:
        a second strip-shaped conductive line; and
        a plurality of second sensing pads, connected to a same side of the second strip-shaped conductive line;
    wherein the first strip-shaped conductive lines of the plurality of first sensing strings cross the second strip-shaped conductive lines of the plurality of second sensing strings, a crossing position of each of the first strip-shaped conductive lines and each of the second strip-shaped conductive lines forms an electrical reference node, one first sensing pad is connected to a first conductive segment of the first strip-shaped conductive line at a same side of each of the electrical reference nodes, and one second sensing pad is connected to a second conductive segment of the second strip-shaped conductive line at a same side of each of the electrical reference nodes.

2. The touch-sensing module according to claim 1, wherein the first sensing pad and the second sensing pad between two adjacent first strip-shaped conductive lines and between two adjacent second strip-shaped conductive lines are approximately fully distributed in an area surrounded by the two adjacent first strip-shaped conductive lines and the two adjacent second strip-shaped conductive lines.

3. The touch-sensing module according to claim 2, wherein the first sensing pad and the second sensing pad between the two adjacent first strip-shaped conductive lines and between the two adjacent second strip-shaped conductive lines are disposed separately from each other.

4. The touch-sensing module according to claim 2, wherein each of the first sensing pads is in a rectangle, and each of the second sensing pads is in a rectangle.

5. The touch-sensing module according to claim 1, wherein each of the first strip-shaped conductive lines and each of the second strip-shaped conductive lines are separated from each other by an insulating material.

6. The touch-sensing module according to claim 5, wherein each of the first strip-shaped conductive lines has a first end and a second end opposite to each other, and each of the second strip-shaped conductive lines has a third end and a fourth end opposite to each other, and wherein the touch-sensing module further comprises:
    a plurality of first traces, electrically connected to the first ends of the first strip-shaped conductive lines respectively;
    a plurality of second traces, electrically connected to the third ends of the second strip-shaped conductive lines respectively; and
    a front frame, covering the first traces, the second traces, the first sensing pads respectively connected to the second ends of the first strip-shaped conductive lines and the second sensing pads respectively connected to the fourth ends of the second strip-shaped conductive lines.

7. The touch-sensing module according to claim 1, wherein the first sensing pads and the second sensing pads are transparent sensing pads.

* * * * *